(12) United States Patent
Akiyama et al.

(10) Patent No.: US 9,880,196 B2
(45) Date of Patent: Jan. 30, 2018

(54) SEMICONDUCTOR DEVICE INSPECTION APPARATUS AND SEMICONDUCTOR DEVICE INSPECTION METHOD

(71) Applicant: Mitsubishi Electric Corporation, Tokyo (JP)

(72) Inventors: Hajime Akiyama, Tokyo (JP); Akira Okada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/268,657

(22) Filed: Sep. 19, 2016

(65) Prior Publication Data

US 2017/0205442 A1 Jul. 20, 2017

(30) Foreign Application Priority Data

Jan. 19, 2016 (JP) ................................. 2016-007630

(51) Int. Cl.
*G01R 1/04* (2006.01)
*G01R 31/28* (2006.01)

(52) U.S. Cl.
CPC ....... *G01R 1/0441* (2013.01); *G01R 31/2891* (2013.01)

(58) Field of Classification Search
CPC ........................... G01R 1/0441; G01R 31/2891
See application file for complete search history.

(56) References Cited

U.S. PATENT DOCUMENTS

| 4,673,839 A * | 6/1987 | Veenendaal | G01L 1/16 310/328 |
|---|---|---|---|
| 6,512,387 B1 * | 1/2003 | Bohn | G01R 31/046 324/762.02 |
| 2013/0106455 A1 * | 5/2013 | Edwards | G01R 31/2891 324/754.1 |
| 2014/0210500 A1 * | 7/2014 | Akiyama | G01R 31/2886 324/750.14 |

FOREIGN PATENT DOCUMENTS

JP 09-051023 A 2/1997

* cited by examiner

*Primary Examiner* — Clayton E LaBalle
*Assistant Examiner* — Jas Sanghera
(74) *Attorney, Agent, or Firm* — Studebaker & Brackett PC

(57) ABSTRACT

A semiconductor device inspection apparatus includes probe sockets and an insulating plate that holds probes via the probe sockets. The probe sockets each include an opposing part that opposes the insulating plate in the direction in which the probe is pressed and has a pressure passive member disposed in the opposing part. The insulating plate is transparent. When pressing force is applied to the tips of the probes, the pressure passive members are pressed between the opposing parts of the probe sockets and the insulating plate. The semiconductor device inspection apparatus further includes a camera to capture an image of the pressure passive members from the opposite side of the insulating plate to the side on which the pressure passive members are disposed, and an image processor to process the image captured by the camera to detect the presence or absence of pressure received by the pressure passive members.

9 Claims, 7 Drawing Sheets

F I G. 1
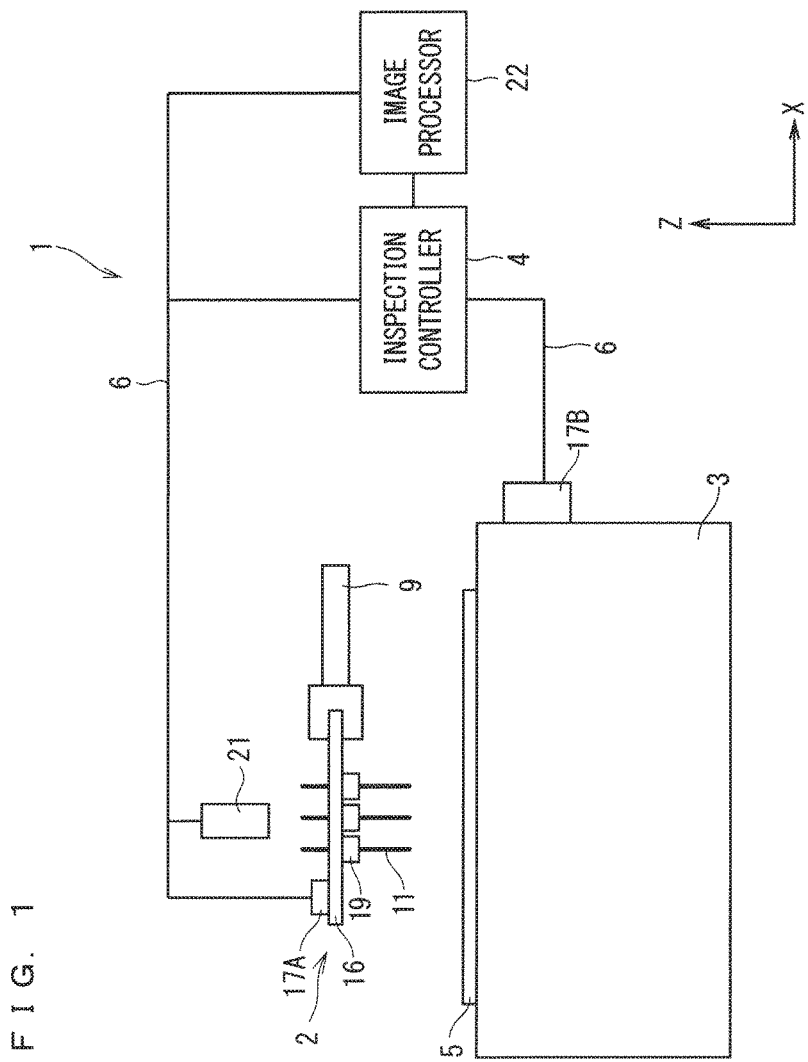

F I G. 3
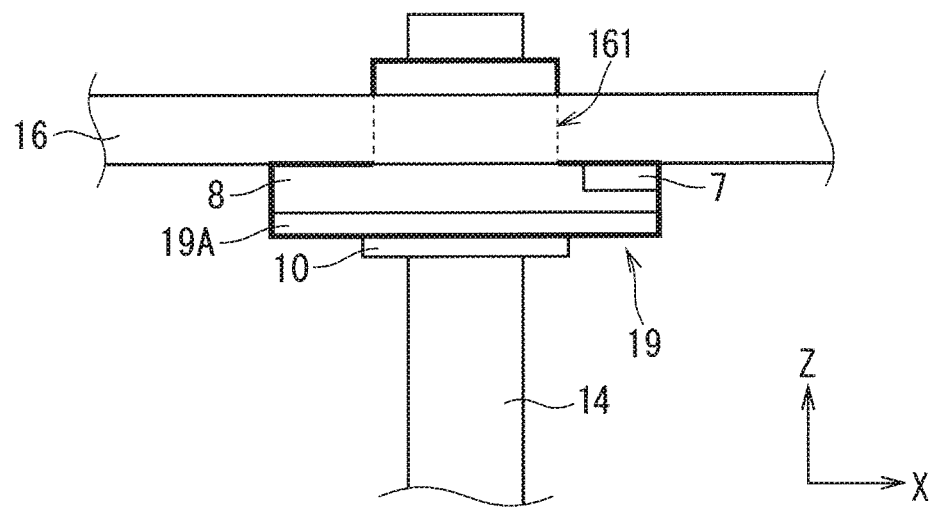
F I G. 4
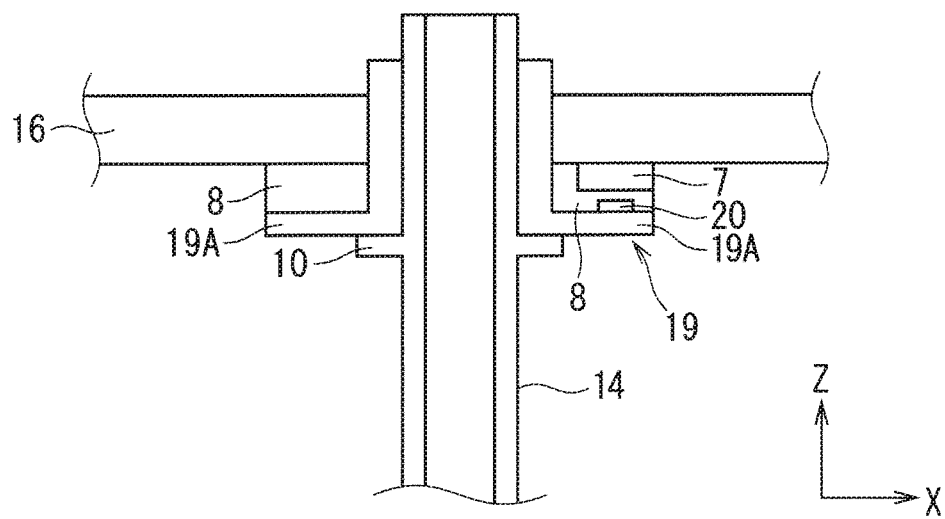

F I G. 9
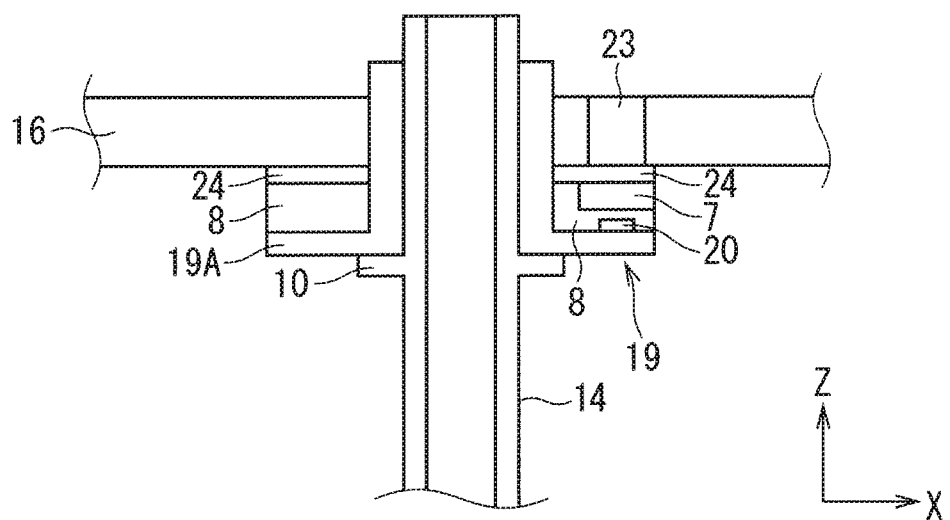

SEMICONDUCTOR DEVICE INSPECTION APPARATUS AND SEMICONDUCTOR DEVICE INSPECTION METHOD

BACKGROUND OF THE INVENTION

Field of the Invention

The present invention relates to a semiconductor device inspection apparatus and a semiconductor device inspection method.

Description of the Background Art

Semiconductor device inspection apparatuses are known that evaluate the electrical characteristics of a semiconductor device to be measured, by bringing the tips of probes into contact with the semiconductor device. Here, the semiconductor device nay, for example, be a semiconductor wafer or a chip that is cut from a semiconductor wafer. When an inspection is conducted, the semiconductor device is fixed to the surface of a chuck stage by, for example, vacuum suction. Then, probes for supplying electrical input and output are brought into contact with electrodes of the semiconductor device from above.

In the inspection of a semiconductor device having a vertical structure in which a large current flows in the vertical direction of the semiconductor device, i.e., from one main surface of the semiconductor device to the other main surface, a chuck stage surface serves as an electrode. Heretofore, the probe has been provided with an increasing number of pins to meet the demand for application of a large current or a high voltage.

In the case of evaluating the electrical characteristics of a semiconductor device to be measured, it is important at the time of evaluation to accurately bring a plurality of probes into contact with electrodes on the surface of the semiconductor substrate. If the contact parts of the probes that are to come in contact with the electrode are misaligned in the height direction, some probes may fail to contact the semiconductor device, and it may not be possible to apply a desired current or voltage to the semiconductor device. Also, if some probes protrude out farther than their appropriate positions, these probes may damage the semiconductor device.

In order to suppress such misalignment of the contact parts of the probes in the height direction, the probes desirably have short lengths. However, in order to suppress electric discharge phenomena, there has been a tendency to increase the lengths of probes and thereby increase the distance between the body part of a probe card and the semiconductor device. Thus, misalignment of the contact parts of the probes in the height direction is more likely to occur.

Under such circumstances, known probe position measurement methods include non-contact measurement techniques. One example is image processing measurement using a camera that is installed to face the probes. However, accurate measurement is difficult with this method due to the presence of a plurality of disturbance elements, such as background, distance, individual focusing, and the influence of attachment, at the time of measuring the positions of the tip portions of the probes.

As another evaluation method, techniques are also known in which a plurality of sensors for detecting pressure are provided either separately from or integrally with the probes (see Japanese Patent Application Laid-Open No. 9-51023).

However, the provision of pressure detecting means for each probe as disclosed in Japanese Patent Application Laid-Open No. 9-51023 has a problem from the viewpoint of cost because if a probe breaks down or is damaged, not only the probe but also the pressure detecting means has to be replaced.

SUMMARY OF THE INVENTION

An object of the present invention is to provide a semiconductor device inspection apparatus and a semiconductor device inspection method for detecting misalignment of a plurality of probes in the height direction at low cost and with high accuracy.

A semiconductor device inspection apparatus according to the present invention includes a probe socket that fixes a probe used to evaluate a semiconductor device, and an insulating plate that holds the probe via the probe socket. The probe socket includes an opposing part that opposes the insulating plate in a direction in which the probe is pressed and that has a pressure passive member disposed in the opposing part. The insulating plate is transparent or is provided with an opening in a portion that overlaps with the pressure passive member in a plan view. In a case where the insulating plate has the opening, the probe socket further includes a transparent member that is disposed between the opening of the insulating plate and the pressure passive member. When a pressing force is applied to a tip of the probe, the pressure passive member is pressed between the opposing part of the probe socket and the insulating plate or the transparent member. The semiconductor device inspection apparatus according to the present invention further includes a camera to capture an image of the pressure passive member from an opposite side of the insulating plate to a side on which the pressure passive member is disposed, and an image processor to process an image captured by the camera to detect the presence or absence of pressure received by the pressure passive member.

In the semiconductor device inspection apparatus according to the present invention, the probe and the probe socket that includes the pressure passive member are configured as separate members. Thus, it is possible to replace only the probe when, for example, a malfunction has occurred in the probe. This reduces the cost of replacement. Moreover, the camera only needs to constantly focus on the pressure passive member. Thus, an image of the pressure passive member can be captured more easily and accurately than in the case where the camera focuses on the tip portion of the probe.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates a configuration of a semiconductor device inspection apparatus according to a first preferred embodiment;

FIG. 3 is a side view of a probe socket of the semiconductor device inspection apparatus according to the first preferred embodiment;

FIG. 4 is a cross-sectional view of the probe socket of the semiconductor device inspection apparatus according to the first preferred embodiment;

FIG. 9 is a cross-sectional view of a probe socket of a semiconductor device inspection apparatus according to a second preferred embodiment.

DESCRIPTION OF THE PREFERRED EMBODIMENTS

First Preferred Embodiment

Overall Configuration

Figure 2:
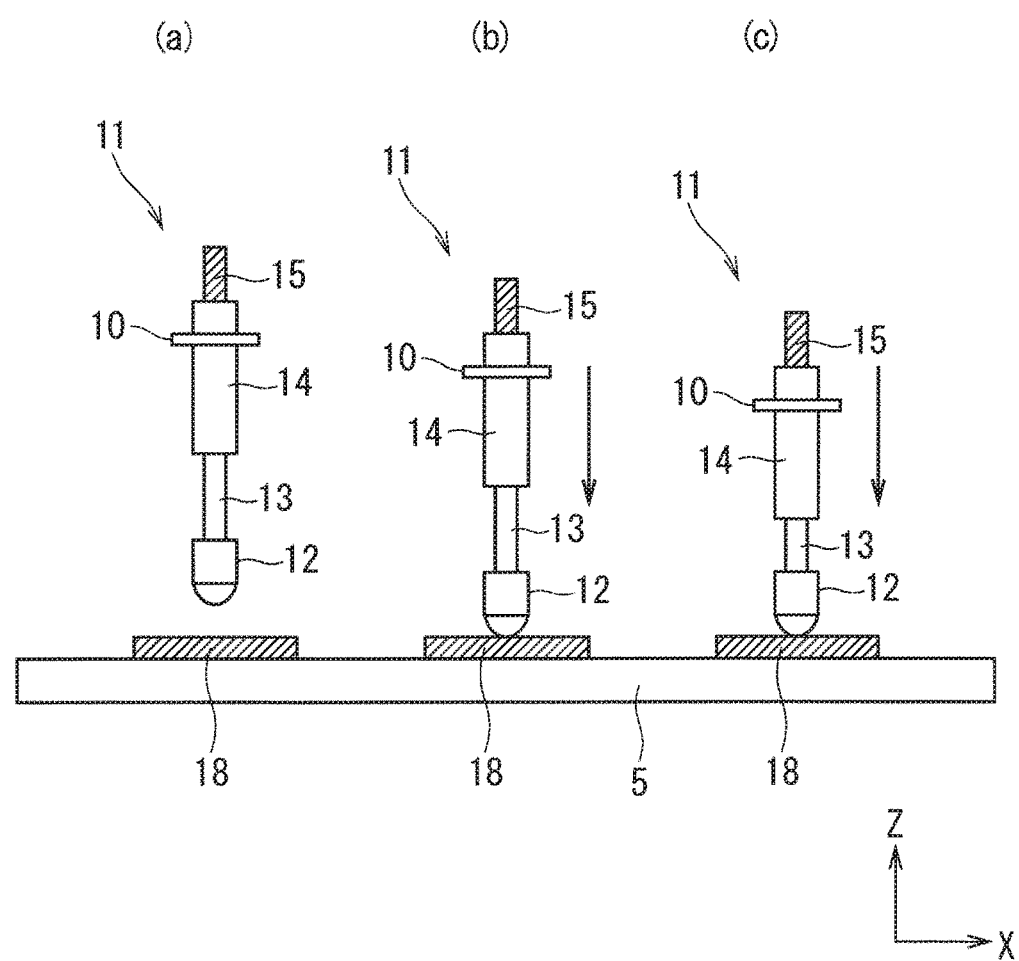
FIG. 2 illustrates the structure of a probe and a sliding (contact) operation of the probe in the semiconductor device inspection apparatus according to the first preferred embodiment.

FIG. 1 illustrates a configuration of a semiconductor device inspection apparatus 1 according to a first preferred embodiment of the present invention. The semiconductor device inspection apparatus 1 of the first preferred embodiment conducts an inspection of probe positions in the height direction before conducting an inspection of a semiconductor device 5, i.e., evaluating the electrical characteristics of the semiconductor device 5.

The semiconductor device inspection apparatus 1 includes probe sockets 19 that fix probes 11 used to inspect the semiconductor device 5, and an insulating plate 16 that holds the probes 11 via the probe sockets 19. The semiconductor device inspection apparatus 1 further includes a camera 21 and an image processor 22. The camera captures an image of pressure passive members 7 from above the insulating plate 16 (i.e., the opposite side of the insulating plate 16 to the side on which the pressure passive members 7 are disposed). The image processor 22 processes the image captured by the camera 21 to detect the presence or absence of pressure received by the pressure passive members 7. The semiconductor device inspection apparatus 1 further includes a chuck stage 3 on which the semiconductor device 5 is to be placed, the probes 11 that are to come in contact with the semiconductor device 5, and an inspection controller 4. The inspection controller 4 evaluates the electrical characteristics of the semiconductor device 5 placed on the upper surface of the chuck stage 3, by exchanging signals with the probes The semiconductor device 5 is fixed to the surface of the chuck stage 3. The chuck stage 3 has a vacuum suction function as means for fixing the semiconductor device 5. The means for fixing the semiconductor device 5 is, however, not limited to vacuum suction and may, for example, be electrostatic suction.

A probe substrate 2 includes the insulating plate 16, the plurality of probes 11, a connector 17A, and the probe sockets 19. The probe substrate 2 is held with a mobile arm 9. The mobile arm 9 is capable of moving the probe substrate 2 to an arbitrary position. While the present example describes a configuration in which the probe substrate 2 is held with the single mobile arm 9, the present invention is not limited to this example, and the probe substrate 2 may be more stably held with a plurality of mobile arms. As another alternative, the chuck stage 3 may be moved, instead of moving the probe substrate 2.

The inspection controller 4 is electrically connected to a connector 17B of the chuck stage 3 and the connector 17A of the probe substrate 2 via signal lines 6.

The semiconductor device 5 placed on and fixed to the chuck stage 3 may, for example, be a semiconductor device having a vertical structure. The semiconductor device with a vertical structure refers to a semiconductor device having main electrodes on front and back surfaces. In the case of inspecting the semiconductor device 5, the electrodes on the front surface side of the semiconductor device 5 are in contact with the probes 11. The electrodes on the back surface side of the semiconductor device 5 are in contact with the upper surface of the chuck stage 3. Note that the semiconductor device 5 may be a semiconductor device having a horizontal structure. The semiconductor device with a horizontal structure has main electrodes on one surface.

In the first preferred embodiment of the present invention, the insulating plate 16 is a transparent member. The insulating plate 16 may, for example, be, but is not limited to, a transparent resin material.

The camera 21 installed above the probe substrate 2 captures an image of the pressure passive members 7, which will be described later, via the transparent insulating plate 16 in order to inspect the heights of the probes 11. The camera 21 may, for example, be a CCD camera. The surface of the insulating plate 16 on the side on which the pressure passive members 7 are located may have an antireflection coating in order to reduce the number of disturbance elements during image capture. The antireflection coating be applied by,for example, affixing an antireflection film to the surface.

In the case of inspecting the semiconductor device 5 with a vertical structure, the probes 11 that are in contact with main electrode pads 18 provided on the upper surface of the semiconductor device 5 serve as one electrode used to establish external connection (see FIG. 2). The surface of the chuck stage 3 that is in contact with the lower surface of the semiconductor device 5 (i.e., the installation surface) serves as the other electrode. The probes 11 are connected to the insulating plate 16 and connected to the inspection controller 4 via the signal line 6 that is connected to the insulating plate 16 via the connector 17A. The surface of the chuck stage 3 is connected to the inspection controller 4 via the signal line 6 that is attached to the connector 17B provided on the side surface of the chuck stage. Note that the plurality of probes 11 are provided, assuming that a large current is applied to the semiconductor device 5. Although not shown, each probe 11 and the connector 17A are electrically connected to each other by, for example, a metal plate provided on the insulating plate 16.

In order to make the density of current applied to each probe 11 roughly coincide, the distance from the connector 17A to each probe 11 is preferably roughly the same. Similarly, the distance from the connector 17B to each probe 11 via the chuck stage 3 is preferably roughly the same. That is, it is preferable for the connector 17A and the connector 17B to be located facing each other, with the probes 11 located therebetween.

FIG. 2 illustrates the structure of one probe. The probe 11 includes a barrel 14, a contact part 12, a push part 13, an electrical connector 15, and a protruding part 10. The barrel 14 is fixed to the insulating plate 16 via the corresponding probe socket 19. The contact part 12 is for mechanically and electrically contacting one main electrode pad 18 provided on the surface of the semiconductor device 5. The push part 13 includes a built-in spring member such as a spring. When the contact part 12 has received pressure upward from below (in the Z axial direction in FIG. 2), the push part 13 slides in a direction in which the push part 13 is pushed into the barrel 14. The electrical connector 15 is electrically connected to the contact part 12 at the tip of the probe 11. The electrical connector 15 is also electrically connected to the connector 17A. The protruding part 10 is in contact with the probe socket 19 in such a form as will be described later.

The probe 11 may be made of, but is not limited to, a metal material having conductivity such as copper, tungsten, or rhenium tungsten. In particular, the contact part 12 may be coated with another material such as gold, palladium, tantalum, or platinum from the viewpoints of, for example, improvements in conductivity and durability.

The sliding operation of the probe 11 is illustrated in parts (a) to (c) of FIG. 2. The probe 11 moves from the initial state in part (a) of FIG. 2 downward in the -Z axial direction toward the main electrode pad 18 on the semiconductor device 5. First, the contact part 12 of the probe 11 contacts the main electrode pad 18 (part (b) of FIG. 2). Then, the probe 11 is further moved downward so that the push part 13 is pushed into the barrel 14 via the spring member, and the contact part 12 and the main electrode pad 18 are reliably in contact with each other (part (c) of FIG. 2).

While the probe 11 is described as including a built-in spring member having slidability in the Z. axial direction, the present invention is not limited to this. The probe 11 may externally include a spring member. The probe 11 is also not limited to a spring-type probe, and may be a cantilever-type probe. The probe 11 may also be of other types, such as a laminated probe or a wire probe.

The inspection controller 4 is implemented by a processing circuit (not shown) The processing circuit may be a CPU (also referred to as a central processing unit, a main frame, a processing unit, an arithmetical unit, a microprocessor, a microcomputer, a processor, or a DSP) that executes programs stored in a memory.

When the processing circuit is dedicated hardware, the processing circuit corresponds to, for example, a single circuit, a complex circuit, a programmed processor, a parallel programmed processor, an ASIC, an FPGA, or a combination thereof.

When the processing circuit is a CPU, the processing circuit implements the operations of the inspection controller 4 by reading out and executing programs stored in a memory. Here, the memory corresponds to, for example, a non-volatile or volatile semiconductor memory such as a RAM, a ROM, a flash memory, an EPROM, or an EEPROM, or to a magnetic disk, a flexible disk, an optical disk, a compact disc, a minidisk, or a DVD.

Note that some operations of the processing circuit may be implemented by dedicated hardware, and some operations may be implemented by software or firmware. In this way, the processing circuit can implement the operations of the inspection controller 4 by means of hardware, software, firmware, or a combination thereof.

The image processor 22 is implemented by a processing circuit (not shown) The processing circuit may be a CPU that executes programs stored in a memory.

When the processing circuit is dedicated hardware, the processing circuit corresponds to, for example, a single circuit, a complex circuit, a programed processor, a parallel programmed processor, an ASIC, an FPGA, or a combination thereof.

When the processing circuit is a CPU, the processing circuit implements the operations of the image processor 22 by reading out and executing programs stored in a memory. Here, the memory corresponds to, for example, a non-volatile or volatile semiconductor memory such as a RAM, a ROM, a flash memory, an EPROM, or an EEPROM, or to a magnetic disk, a flexible disk, an optical disk, a compact disc, a minidisk, or a DVD.

Note that some operations of the processing circuit may be implemented by dedicated hardware, and some operations may be implemented by software or firmware. In this way, the processing circuit can implement the operations of the image processor by means of hardware, software, firmware, or a combination thereof.

Structure of Probe Socket

The probes 11 are mounted on the insulating plate 16 via the probe sockets 19, which serve as installation jigs of the probes 11. FIG. 3 is a side view of one probe socket 19. FIG. 4 is a cross-sectional view of the probe socket 19. To illustrate the relation with other members, part of the insulating plate 16 and part of the probe 11 are also illustrated in FIGS. 3 and 4.

The probe socket 19 includes a flange part 19A. The flange part 19A is a part that opposes the insulating plate 16 in the direction in which the probe 11 is pressed (Z axial direction). The pressure passive member 7 is disposed in the flange part 19A. When a pressing force is applied to the contact part 12 the tip of the probe 11, the pressure passive member 7 is pressed between the flange part 19A of the probe socket 19 and the insulating plate 16.

The insulating plate 16 has through holes 161 as illustrated in FIG. 3. The probe sockets 19 fit in the through holes 161 of the insulating plate 16. As illustrated in FIG. 4, the surface of the flange part 19A of the probe socket 19 that opposes the insulating plate 16 has a projection 20 at a position corresponding to the pressure passive member 7. That is, the pressure passive member 7 is disposed between the projection 20 and the insulating plate 16. Also, an elastic member 8 is disposed between the projection 20 and the pressure passive member 7 as illustrated in FIG. 4.

The pressure passive member 7 is mounted along at least part of the flange part 19A of the probe socket 19. The pressure generated in the probe 11 after contacting the semiconductor device 5 is transmitted through the protruding part 10 of the probe 11 to the flange part 19A of the probe socket 19 and then transmitted to the pressure passive member 7.

The barrel 14 of the probe 11 and the probe socket 19 operate as one unit. The projection 20 on the surface of the flange part 19A of the probe socket 19 on the insulating plate 16 side functions to appropriately apply pressure to the pressure passive member 7. The pressing of the pressure passive member 7 by the projection 20 via the elastic member 8 suppresses damage to the pressure passive member 7 and increases the lifetime of the pressure passive member 7.

Examples of the pressure passive member 7 include, but are not limited to, transparent materials such as a flexible member sealed with vinyl and a piezochromic light-emitting material. The flexible member is a member with flowability so as to be displaced when pressed by the projection 20 while the probe is in a contact state, and is also a member having color due to the necessity to, when displaced, produce contrast at the point of displacement. The flexible member may, for example, be a colored liquid such as an antifreeze solution.

The piezochromic light-emitting material is a material that produces a change in light emission at the time of application of pressure, and one example is a material having a fluorescent perylene ring. The elastic member 8 is a sheet that serves as a buffer material having elasticity, insulating properties, and heat resistance, and may for example be, but is not limited to, thin silicone rubber.

The barrel 14 of the probe 11 has the protruding part 10. As illustrated in FIGS. 3 and 4, this protruding part 10 catches on the end of the probe socket 19 so that the probe 11 is removably installed in the probe socket 19. The probe socket 19 is inserted into and fits in the through hole 161 of the insulating plate 16 and is thus held by the insulating plate 16. The probe socket 19 is smoothly slidable along the inner wall of the through hole 161 of the insulating plate 16 according to the contact pressure between the probe 11 and the semiconductor device 5. The upper end of the probe socket 19 has an engagement part (not shown) in order to prevent the probe socket 19 from slipping out of the through hole 161 of the insulating plate 16. This engagement part is freely engageable with and disengageable from the upper surface of the insulating plate 16.

The barrel 14 of the probe 11 is removably mounted in the probe socket 19. Thus, the probe socket 19 and the probe 11 slide integrally. The probe socket 19 has the flange part 19A at the end on which the protruding part 10 of the barrel 14 catches. The flange part 19A extends from the probe socket 19 in a direction intersecting with (including "orthogonal to") the sliding direction of the probe 11.

Figure 5:
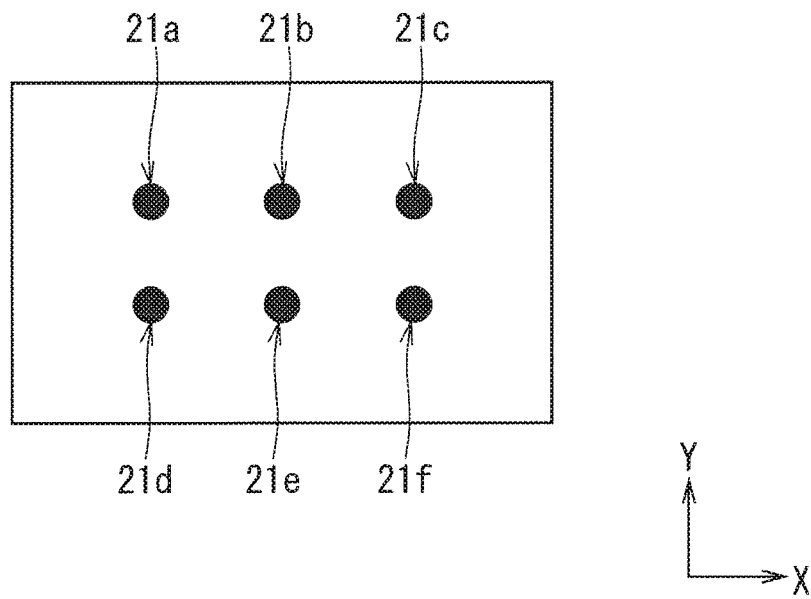
FIGS. 5 to 7 are schematic diagrams of images captured by a camera in the semiconductor device inspection apparatus according to the first preferred embodiment.

The heights of the probes 11 are inspected by the image processor 22 processing the image captured by the camera 21 to detect the presence or absence of pressure received by the pressure passive members 7. The image processing includes recognition of the image of the pressure passive members 7. FIG. 5 is a schematic diagram of an image captured by the camera 21 when six probes 11 are at normal heights. The captured image in FIG. 5 shows the appearance of light emission of the pressure passive members 7 in all six regions 21a to 21f. This is the case of using a piezochromic light-emitting material for the pressure passive members 7 and indicates that all of the six probes 11 are in contact with the semiconductor device 5.

Figure 6:
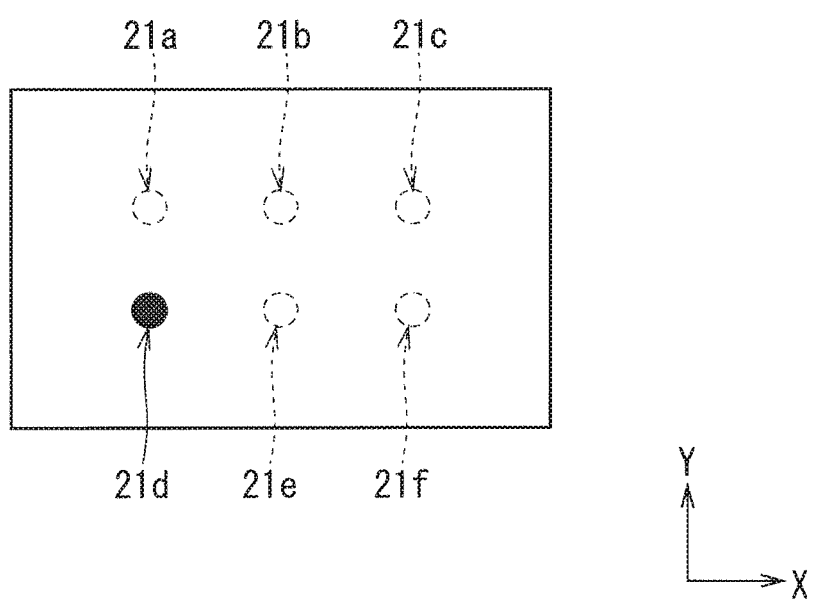

FIG. 6 is a schematic diagram of another image captured by the camera 21 when there is an abnormality' in the heights of the probes 11. The captured image shows the light emission of the pressure passive member 7 in the region 21d, but does not show the light emission of the pressure passive members 7 in the other regions 21a, 21b, 21c, 21e, and 21f. This indicates that there is an abnormality in the height of the probe 11 corresponding to the region 21d, and that this probe 11 has contacted the semiconductor device 5 before the other probes 11.

Figure 7:
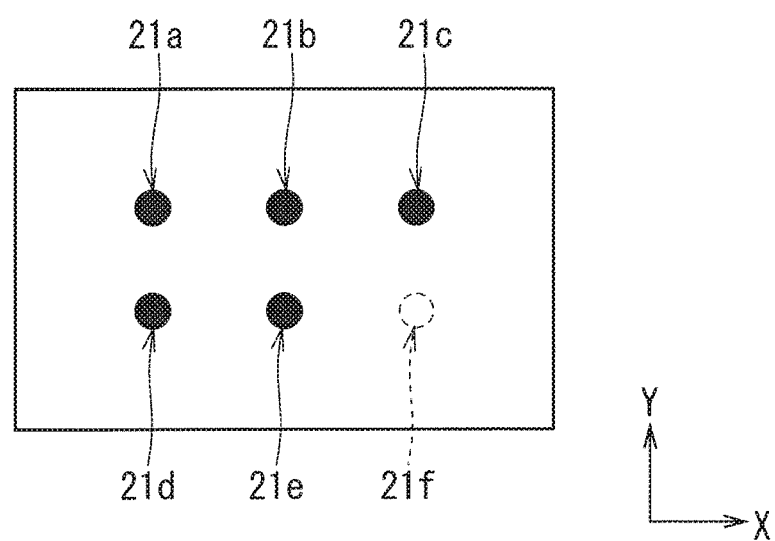

Similarly, FIG. 7 is a schematic diagram of another image captured by the camera 21 when there is an abnormality in the heights of the probes 11. The captured image shows the light emission of the pressure passive members 7 in the regions 21a, 21b, 21c, 21d, and 21e, but does not show the light emission of the pressure passive member 7 in the region 21f. This indicates that there is an abnormality in the height of the probe 11 corresponding to the region 21f, and that the probe 11 corresponding to the region 21f is not in contact with the semiconductor device 5 when the probes 11 corresponding to the regions 21a, 21b, 21c, 21d, and 21e have contacted the semiconductor device 5. The image processor 22 performs image processing for recognizing the aforementioned presence or absence of light emission.

When the pressure passive member 7 is a flexible member having color, a region where the pressure passive member 7 is not pressed by the projection 20, and thus where the pressure passive member 7 is present, is represented by pixels that are colored with the color of the pressure passive member 7, in the image captured by the camera 21. On the other hand, in a region where the pressure passive member 7 is pressed by the projection 20, the pressure passive member 7 is eliminated and thus is not present. The image processor 22 performs image processing for recognizing this difference in color.

To facilitate comprehension of the drawings, the images illustrated in FIGS. 5 to 7 have omitted constituent elements such as the probes 11, and show only changes in the pressure passive members 7. If an abnormality has been detected in the heights of the probes 11, the image processor 22 notifies the inspection controller 4 that the positions of the probes 11 in the height direction are not appropriate. In response, the inspection controller 4 stops or suspends the inspection of the semiconductor device 5. For example, the inspection controller 4 issues an alarm to the user to notify the user that the inspection of the semiconductor device 5 has stopped (or is suspended). In addition, the inspection controller 4 may also notify the user, by means of voice or the like, that the positions of the probes 11 in the height direction are not appropriate. The user who has received the notification may, for example, check the probes 11.

Operations

The inspection of the semiconductor device 5 is conducted by pressing the probes 11 against the main electrode pads 18 provided on the surface of the semiconductor device 5. The inspection of the probe positions in the height direction is also conducted while the probes 11 are pressed against the semiconductor device 5 in the same manner as the actual inspection of the semiconductor device 5.

Figure 8:
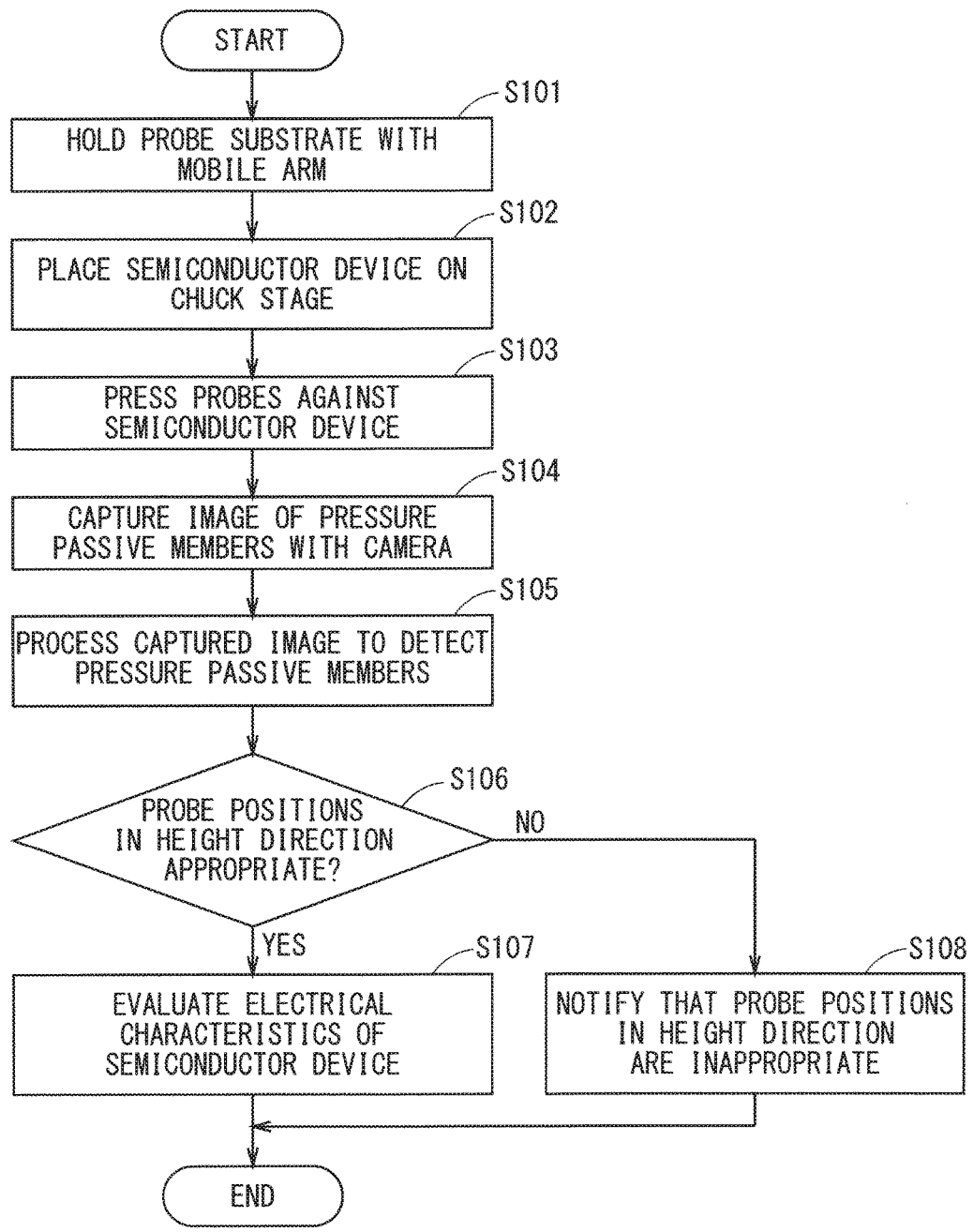
FIG. 8 is a flowchart of operations performed by the semiconductor device inspection apparatus according to the first preferred embodiment.

The operations of the semiconductor device inspection apparatus 1 according to the first preferred embodiment of the present invention will now be described. FIG. 8 is a flowchart of the operations of the semiconductor device inspection apparatus.

First, the probe substrate 2 is prepared. The probe substrate 2 includes an arrangement of a plurality of probes 11 that correspond to the electrodes of the semiconductor device 5 to be inspected. The probe substrate 2 is held with the mobile arm 9 (step S101). At this time, the connector 17A of the probe substrate 2 is electrically connected to the signal line 6.

Next, the semiconductor device 5 to be inspected is placed on the chuck stage 3 (step S102). At this time, the semiconductor device 5 is fixed by, for example, vacuum suction and is in electrical contact with the chuck stage 3. Here, the semiconductor device 5 may, for example, be a semiconductor wafer in which a plurality of semiconductor chips are formed. The semiconductor device 5 is, however, not limited to this.

Then, the inspection controller 4 controls the mobile arm 9 to move the probe substrate 2 to above the chuck stage 3. The inspection controller 4 further controls the mobile arm 9 to align the probes 11 in the XY plane relative to the semiconductor device 5 (to be more specific, semiconductor chips to be inspected) and then to move the probe substrate 2 downward. That is, the probe substrate 2 is moved downward toward the semiconductor device 5.

When the inspection controller 4 further moves the probe substrate 2 downward after the contact parts 12 of the probes 11 have contacted the main electrode pads 18 of the semiconductor device 5, the push parts 13 are pushed into the barrels 14 via the spring members, and the protrusions 10 of the probes 11 press the flange parts 19A of the probe sockets 19. Accordingly, the projections 20 on the flange parts 19A of the probe sockets 19 press the pressure passive members 7 via the elastic members 8 between the insulating plate 16 and the projections 20 (step S103).

In the state in which the probes 11 are in contact with the main electrode pads 18 of the semiconductor device 5, the camera 21 captures an image of the pressure passive members 7 from above the insulating plate 16 (step S104).

Then, the image processor 22 processes the image captured by the camera 21 to detect the pressure passive members 7 located at positions corresponding to the probes 11 (step S105). That is, the image processor 22 detects whether or not the pressure passive members 7 located at the positions corresponding to the probes 11 have received pressure.

The image processor 22 determines, on the basis of the result of detection of the pressure passive members 7, whether the probe positions in the height direction are appropriate (step S106).

For example, when the image illustrated in FIG. 5 is recognized in step S105, the image processor 22 determines in step S106 that the probe positions in the height direction are appropriate, because all of the probes 11 are located at appropriate positions in the height direction. In this case, the image processor 22 notifies the inspection controller 4 that the probe positions are appropriate. In response, the inspection controller 4 conducts the inspection of the semiconductor device 5 by using the probes 11 disposed on the probe substrate 2 (step S107).

On the other hand, when the image illustrated in FIG. 6 or 7 is recognized in step S105, the image processor 22 determines in step S106 that the probe positions in the height direction are not appropriate, because at least one of the probes 11 is located at an inappropriate position in the height direction. In this case, the image processor 22 notifies the inspection controller 4 that the probe positions in the height direction are not appropriate (step S108). In response, the inspection controller 4 stops or suspends the inspection of the semiconductor device 5. For example, the inspection controller 4 notifies the user, by issuing an alarm, that the inspection of the semiconductor device 5 has stopped (or is suspended). In addition, the inspection controller 4 may also notify the user, by means of voice or the like, that the positions of the probes 11 in the height direction are not appropriate. The user who has received the notification may, for example, check the probes 11.

The inspection of the positions of the probes 11 in the height direction is conducted for each semiconductor device 5 to be evaluated. Alternatively, this inspection may be conducted at predetermined fixed intervals (e.g., every time after the inspection of a predetermined number of semiconductor devices 5 has ended).

The above-described series of steps S104 to S106 may be performed multiple times while moving the probe substrate 2 downward toward the semiconductor device 5. Alternatively, the inspection of the positions of the probes 11 in the height direction may be conducted during the inspection of the semiconductor device 5.

Advantageous Effects

The semiconductor device inspection apparatus 1 according to the first preferred embodiment of the present invention includes the probe sockets 19 that fix the probes 11 used to evaluate a semiconductor device, and the insulating plate 16 that holds the probes 11 via the probe sockets 19. The probe sockets 19 include an opposing part that opposes the insulating plate 16 in the direction in which the probes 11 are pressed and has the pressure passive members 7 disposed in the opposing part. The insulating plate 16 is transparent. When a pressing force is applied to the tips of the probes 11, the pressure passive members 7 are pressed between the opposing parts of the probe sockets 19 and the insulating plate 16. The semiconductor device inspection apparatus 1 further includes the camera 21 to capture an image of the pressure passive members 7 from the opposite side of the insulating plate 16 to the side on which the pressure passive members 7 are disposed, and the image processor 22 to process the image captured by the camera 21 to detect the presence or absence of pressure received by the pressure passive members 7.

In the first preferred embodiment of the present invention, the probe sockets 19 that include the pressure passive members 7, and the probes 11 are configured as separate members. Thus, it is possible to replace only the probes 11 when, for example, a malfunction has occurred in the probes 11. This reduces the cost of replacement. Moreover, in the first preferred embodiment of the present invention, the camera 21 only needs to constantly focus on the pressure passive members 7. Thus, an image of the pressure passive members 7 can be captured more easily and accurately than in the case where the camera focuses on the tip portions of the probes 11.

Moreover, by conducting the inspection of the positions of the probes 11 in the height direction before the inspection of the semiconductor device 5, it is possible to avoid situations where excess load or distortion may be applied on the semiconductor device 5, and to improve the accuracy of measurement. The inspection of the positions of the probes 11 in the height direction may be conducted during the inspection of the semiconductor device 5. In the first preferred embodiment of the present invention, the pressure passive members 7 are provided on the probe socket 19 side. This eliminates the need to additionally provide the pressure passive members 7 in the individual probes 11 and achieves the effect of cost reduction.

In the semiconductor device inspection apparatus 1 according to the first preferred embodiment of the present invention, the insulating plate 16 has the through holes 161, and the probe sockets 19 fit in the through holes 161. The probe sockets 19 include the flange parts 19A as opposing parts, and the surfaces of the flange parts 19A that oppose the insulating plate 16 have the projections 20. The pressure passive members 7 are disposed between the projections 20 and the insulating plate 16.

This configuration in which the pressure passive members 7 are pressed by the projections 20 provided on the surfaces of the flange parts 19A that oppose the insulating plate 16 allows the pressure received from the probes 11 by the probe sockets 19 to be concentrated on the tips of the projections 20, and thereby allows the pressure passive members 7 to be pressed under higher pressure. It is thus possible to improve the accuracy in the inspection of the positions of the probes 11 in the height direction.

In the semiconductor device inspection apparatus 1 according to the first preferred embodiment of the present invention, the probe sockets 19 further include the elastic members 8 disposed between the projections 20 and the pressure passive members 7.

The provision of the elastic members 8 between the projections 20 of the probe sockets 19 and the pressure passive members 7 prevents the projections 20 from directly contacting the pressure passive members 7, thus protecting the pressure passive members 7 and increasing the lifetime of the pressure passive members 7.

In the semiconductor device inspection apparatus 1 according to the first preferred embodiment of the present invention, the pressure passive members 7 are made of a colored flexible material.

When the pressure passive members 7 are made of a flexible material, the pressure passive members 7 can be eliminated by causing the projections 20 to dig into the portions of the pressure passive members 7 that are in contact with the projections 20. Moreover, the use of the colored pressure passive members 7 allows the regions where the pressure passive members 7 are present and the regions where the pressure passive members 7 are not present (i.e., eliminated by the projections 20) to be distinguished by color. It is also possible to avoid the appearance of disturbance elements (background) during image capture by the camera 21.

In the semiconductor device inspection apparatus 1 according to the first preferred embodiment of the present invention, the pressure passive members 7 may be made of a piezochromic light-emitting material that emits light under pressure.

When the pressure passive members 7 are made of a piezochromic light-emitting material, regions where the pressure passive members 7 are under pressure and regions where the pressure passive members 7 are not under pressure can be distinguished by the presence or absence of light emission and by color. Thus, by pressing the protruding parts 10 of the probe sockets 19 against the pressure passive members 7, light emission depending on the application of pressure can be used to detect whether the tips of the probes 11 are pressed against the semiconductor device 5.

In the semiconductor device inspection apparatus 1 according to the first preferred embodiment of the present invention, the surface of the insulating plate 16 on the opposite side to the side on which the pressure passive members 7 are disposed may have an antireflection coating in regions that overlap with the pressure passive members 7 in a plan view.

In this case, it is possible to suppress disturbances in the image captured by the camera 21, which are caused by the reflection of light at the surface of the insulating plate 16, and to thereby improve the accuracy of detection of the pressure passive members 7.

In the semiconductor device inspection apparatus 1 according to the first preferred embodiment of the present invention, the antireflection coating may be an antireflection film. The antireflection coating can be easily applied by affixing an antireflection film to the insulating plate 16.

The semiconductor device inspection apparatus 1 according to the first preferred embodiment of the present invention further includes the chuck stage 3 on which the semiconductor device 5 is to be placed, the probes 11 that contact the semiconductor device 5, and the inspection controller 4 to evaluate the electrical characteristics of the semiconductor device 5 placed on the upper surface of the chuck stage 3, by exchanging signals with the probes 11.

The semiconductor device inspection apparatus 1 can conduct the inspection of the positions of the probes 11 in the height direction before conducting the inspection of the semiconductor device 5. This prevents the inspection of the semiconductor device 5 from being conducted while the probes 11 remain located at inappropriate positions in the height direction. Thus, a more accurate and more reliable inspection can be conducted on the semiconductor device 5.

A semiconductor device inspection method according to the first preferred embodiment of the present invention is a semiconductor device inspection method using the semiconductor device inspection apparatus 1. The method includes (a) capturing the image of the pressure passive members 7 from the opposite side of the insulating plate 16 to the side on which the pressure passive members 7 are disposed, while causing the inspection controller 4 to move the probes 11 toward the semiconductor device 5, (b) processing the image captured by the camera 21 to determine whether the probes 11 are pressed against the semiconductor device 5, and (c) determining, on the basis of the result of the determination by the image processor 22, whether or not to evaluate the electrical characteristics of the semiconductor device 5.

By conducting the inspection of the positions of the probes 11 in the height direction before the evaluation of the semiconductor device 5, it is possible to avoid situations where excess load or distortion may be applied on the semiconductor device 5, and to improve the accuracy of measurement. Alternatively, the inspection of the positions of the probes 11 in the height direction may be conducted during the evaluation of the semiconductor device 5.

Second Preferred Embodiment

FIG. 9 is a cross-sectional view of a probe socket 19 according to a second preferred embodiment. The probe socket 19 according to the second preferred embodiment of the present invention further includes a transparent member 24, when compared to the probe sockets 19 of the first preferred embodiment (FIGS. 3 and 4). The transparent member 24 is disposed between the pressure passive member 7 and the insulating plate 16 as illustrated in FIG. 9. The transparent member 24 may for example be, but is not limited to, a transparent resin plate such as an acrylic plate.

In the semiconductor device inspection apparatus 1 according to the second preferred embodiment of the present invention, the insulating plate 16 is not transparent and may, for example, be a printed circuit board. As illustrated in FIG. 9, the insulating plate 16 has openings 23 in portions that overlap with the pressure passive members 7 in a plan view. The other constituent elements are the same as those of the first preferred embodiment, and redundant descriptions thereof will not be given.

The camera 21 is capable of capturing an image of the pressure passive members 7 through the openings 23 of the insulating plate 16 and the transparent members 24. While the first preferred embodiment describes an example of the case where the pressure passive members 7 are pressed against the transparent insulating plate 16, the second preferred embodiment of the present invention describes an example in which the pressure passive members 7 are pressed against the transparent members 24.

The operations of the semiconductor device inspection apparatus 1 according to the second preferred embodiment of the present invention are the same as those described in the first preferred embodiment, and redundant descriptions thereof will not be given.

Advantageous Effects

The semiconductor device inspection apparatus 1 according to the second preferred embodiment of the present invention includes the probe sockets 19 that fix the probes 11 used to evaluate the semiconductor device 5, and the insulating plate 16 that holds the probes 11 via the probe sockets 19. The probe sockets 19 include an opposing part that opposes the insulating plate 16 in the direction in which the probes 11 are pressed and has the pressure passive members 7 disposed in the opposing part. The insulating plate 16 has the openings 23 in the portions that overlap with the pressure passive members 7 in a plan view. When the insulating plate 16 has the openings 23, the probe sockets 19 further include the transparent members 24 disposed between the openings 23 of the insulating plate 16 and the pressure passive members 7. When a pressing force is applied to the tips of the probes 11, the pressure passive members 7 are pressed between the opposing parts of the probe sockets 19 and the transparent members 24. The semiconductor device inspection apparatus 1 further includes the camera 21 that captures an image of the pressure passive members 7 from the opposite side of the insulating plate 16 to the side on which the pressure passive members 7 are disposed, and the image processor 22 that processes the image captured by the camera 21 to detect the presence or absence of pressure received by the pressure passive members 7.

Thus, the second preferred embodiment of the present invention can not only achieve the advantageous effect described in the first preferred embodiment, but also makes it possible to capture an image of the pressure passive members 7 even if the insulating plate 16 does not have transparency, as long as the insulating plate 16 has the openings 23 in the portions that overlaps with the pressure passive members 7 in a plan view. Thus, insulating plates such as printed circuit boards can also be used.

While the invention has been shown and described in detail, the foregoing description is in all aspects illustrative and not restrictive. It is therefore to be understood that numerous modifications and variations can be devised without departing from the scope of the invention.

What is claimed is:

1. A semiconductor device inspection apparatus, comprising:
    a probe socket that fixes a probe used to evaluate a semiconductor device; and
    an insulating plate that holds said probe via said probe socket,
    wherein said probe socket includes an opposing part, that opposes said insulating plate in a direction in which said probe is pressed and has a pressure passive member disposed in said opposing part,
    said insulating plate is transparent or is provided with an opening in a portion that overlaps with said pressure passive member in a plan view,
    in a case where said insulating plate has said opening, said probe socket further includes a transparent member that is disposed between said opening of said insulating plate and said pressure passive member, and
    when a pressing force is applied to a tip of said probe, said pressure passive member is pressed between said opposing part of said probe socket and said insulating plate or said transparent member,
    the semiconductor device inspection apparatus further comprising:
    a camera to capture an image of said pressure passive member from an opposite side of said insulating plate to a side on which said pressure passive member is disposed; and
    an image processor to process an image captured by said camera to detect the presence or absence of pressure received by said pressure passive member.

2. The semiconductor device inspection apparatus according to claim 1, wherein
    said insulating plate has a through hole,
    said probe socket fits in said through hole,
    said probe socket includes a flange part as said opposing part,
    said flange part has a projection on a surface on a side that opposes said insulating plate, and
    said pressure passive member is disposed between said projection and said insulating plate.

3. The semiconductor device inspection apparatus according to claim 2, wherein
    said probe socket further includes an elastic member that is disposed between said projection and said pressure passive member.

4. The semiconductor device inspection apparatus according to claim 1, wherein
    said pressure passive member is a colored flexible material.

5. The semiconductor device inspection apparatus according to claim 1, wherein
    said pressure passive member includes a piezochromic light-emitting material that emits light under pressure.

6. The semiconductor device inspection apparatus according to claim 1, wherein
    a surface of said insulating plate on the opposite side to the side on which said pressure passive member is disposed has an antireflection coating in a region that overlaps with said pressure passive member in a plan view.

7. The semiconductor device inspection apparatus according to claim 6, wherein
    said antireflection coating includes an antireflection film.

8. The semiconductor device inspection apparatus according to claim 1, further comprising:
    a chuck stage on which said semiconductor device is to be placed;
    said probe that contacts said semiconductor device; and
    an inspection controller to evaluate an electrical characteristic of said semiconductor device placed on an upper surface of said chuck stage, by exchanging a signal with said probe.

9. A semiconductor device inspection method using the semiconductor device inspection apparatus according to claim 8, the method comprising;
    (a) capturing an image of said pressure passive member from the opposite side of said insulating plate to the side on which said pressure passive member is disposed, while causing said inspection controller to move said probe toward said semiconductor device;
    (b) processing the image captured by said camera to determine whether said probe is pressed against said semiconductor device; and
    (c) determining, on the basis of a result of the determination by said image processor, whether or not to evaluate an electrical characteristic of said semiconductor device.

* * * * *